United States Patent
Dammköhler et al.

(10) Patent No.: US 6,593,732 B2
(45) Date of Patent: Jul. 15, 2003

(54) SENSOR MODULE

(75) Inventors: Jörg Dammköhler, Kelkheim (DE); Eckhart Kern, Hofheim (DE); Martin Degen, Bad Homburg (DE); Wolfgang Porth, Frankfurt (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/004,298

(22) Filed: Oct. 31, 2001

(65) Prior Publication Data

US 2002/0067162 A1 Jun. 6, 2002

(30) Foreign Application Priority Data

Oct. 27, 2000 (DE) ..................... 200 18 538 U

(51) Int. Cl.$^7$ .................. G01R 33/00; G01B 7/30; H01R 43/00
(52) U.S. Cl. .................. 324/207.21; 324/252; 324/262; 29/827; 73/493
(58) Field of Search .................. 324/173, 174, 324/207.2, 207.21, 207.24, 207.25, 262; 257/427, 690–694, 696–697; 361/142, 735, 745, 813; 73/493; 338/32 H, 32 R; 29/825, 827, 844

(56) References Cited

U.S. PATENT DOCUMENTS

| | | | | |
|---|---|---|---|---|
| 4,283,679 A | * | 8/1981 | Ito et al. ..................... 324/165 |
| 4,495,546 A | | 1/1985 | Nakamura et al. |
| 4,994,739 A | * | 2/1991 | Honda et al. .......... 324/207.14 |
| 5,488,294 A | * | 1/1996 | Liddell et al. ......... 324/207.21 |
| 5,508,563 A | | 4/1996 | Tazawa et al. |
| 5,574,365 A | * | 11/1996 | Oyama et al. ......... 324/207.24 |
| 5,581,179 A | * | 12/1996 | Engel et al. ............. 324/207.2 |
| 5,631,557 A | * | 5/1997 | Davidson ..................... 324/174 |
| 5,670,876 A | * | 9/1997 | Dilger et al. .......... 324/207.13 |
| 5,912,556 A | * | 6/1999 | Frazee et al. ............ 324/207.2 |
| 5,963,028 A | * | 10/1999 | Engel et al. ............. 324/207.2 |
| 5,998,989 A | * | 12/1999 | Lohberg ..................... 324/174 |
| 6,003,369 A | * | 12/1999 | Tola et al. ..................... 73/493 |
| 6,020,736 A | * | 2/2000 | Aoyama et al. ....... 324/207.21 |
| 6,326,779 B1 | * | 12/2001 | Shinjo et al. .......... 324/207.21 |
| 6,455,907 B1 | * | 9/2002 | Parsons et al. ............. 257/421 |

FOREIGN PATENT DOCUMENTS

| | | | | |
|---|---|---|---|---|
| DE | 41 23 407 A1 | 1/1993 | ........... H05K/1/00 |
| DE | 43 17 259 A1 | 11/1993 | ........... G05D/3/12 |
| DE | 44 45 120 A1 | 6/1995 | ........... G01P/3/488 |
| DE | 44 04 265 C2 | 8/1995 | ........... G01P/21/00 |
| DE | 195 05 759 C2 | 9/1996 | ........... H03K/17/97 |
| DE | 19747177 A1 | 4/1999 | ........... H01L/23/50 |
| EP | WO 9602848 A1 | 2/1996 | ........... G01R/33/02 |
| EP | 1022568 A1 | 7/2000 | ........... G01P/3/481 |

OTHER PUBLICATIONS

IBM Technical Disclosure Bulletin, vol. 38, No. 6, Jun., 1995, pp. 1 and 2.
English Abstract of "Magnetic Sensors Based on the AMR–Effect," by Klaus C.J. Dietmayer, Feb. 15, 2001, pp. 269–279.

* cited by examiner

*Primary Examiner*—Jay Patidar
*Assistant Examiner*—Darrell Kinder
(74) *Attorney, Agent, or Firm*—Richard A. Speer; Mayer, Brown, Rowe & Maw

(57) ABSTRACT

A position sensor module in which a position sensor delivers a signal output to an electronic evaluation unit for further processing, wherein the sensor module and evaluation unit are mounted on and electrically connected by a shaped sheet metal part to eliminate the need for tuning adjustments between the position sensor and the electronic evaluation unit.

7 Claims, 3 Drawing Sheets

SENSOR MODULE

The invention relates to a sensor module in which a position sensor is connected to an electronic evaluation unit which conditions the signal output by the position sensor and corresponding to the position of a component to be monitored.

BACKGROUND OF THE INVENTION

In known sensors, the signal output by the sensor is fed to an electronic evaluation unit which conditions the sensor signal for further processing by a connected electronic system. Thus, for example, the signal of a position sensor arranged in a motor vehicle, which represents a variation in the position of a component to be monitored such as the throttle valve, is relayed to an electronic engine management system which generates a control signal for driving the internal combustion engine on the basis of the sensor signal.

In the electronic evaluation unit, the sensor signal is amplified and an output signal is generated which is corrected in terms of the zero point and/or temperature.

When the sensor and the electronic evaluation unit are being installed, the two must be tuned to one another. After a preliminary adjustment at the respective manufacturer, the two individual parts must be tuned to one another yet again when being installed in the apparatus which contains the component whose position is to be monitored. Such an adjustment is very complicated. The spatial separation of sensor and electronic evaluation unit requires an additional outlay on wiring.

BRIEF SUMMARY OF THE INVENTION

It is therefore the object of the invention to specify a sensor arrangement which can be produced simply and with a reduced outlay on adjustment.

According to the invention, the object is achieved by virtue of the fact that the position sensor and the electronic evaluation unit are jointly arranged at or on a shape sheet-metal part, the shaped sheet-metal part being designed as a conductor track structure, at least between the sensor and an electronic evaluation unit for the purpose of an electric connection, which conductor track structure is angled off to adapt to the installation site of the sensor.

The advantage of the invention consists in that accurate placement of the sensor on the component to be monitored is possible owing to the arrangement on a shaped sheet-metal part. It is possible to dispense with connecting lines between the sensor and electronic evaluation unit, thereby reducing the size of the design of the module. The sensor and electronic evaluaton unit are adjusted jointly in one step. Not only can a position sensor module thus created be programmed simply in offset and measuring range, but it can also be used for diagnostic purposes such as, for example, to determine a line breakage or short circuit between the sensor and electronic evaluation unit.

In a preferred embodiment, the sensor is designed as a magnetoresistive sensor which is arranged in a magnetic field.

The sensor is advantageously arranged approximately at the center of a cylindrically designed permanent magnet. An accurate placement of the sensor in the homogeneous part of the magnetic field is possible owing to the angling-off of the shaped sheet-metal part.

In an advantageous refinement, the sensor is positioned at a first outer end of the shaped sheet-metal part, the end of the shaped sheet-metal part which projects beyond the electronic evaluation unit in the opposite direction to the sensor being formed by at least one freely ending conductor track of the shaped sheet-metal part. A simple electric connection of the shaped sheet-metal part to other electric circuits is possible in this way.

In a development of the invention, the free end of the shaped sheet-metal part is electrically connected to a second shaped sheet-metal part, which supports passive electric components and on which the contact device is formed. Because of the use of shaped sheet-metal parts, components required for particular applications can be arranged thereon and connected to one another electrically via the shaped sheet-metal part, and thereby form a compact device which is mounted in vibration-free fashion, particularly for use in motor vehicles. Contact may be made between the two shaped sheet-metal parts with the aid of conventional joining techniques such as welding or soldering.

The contact device or the free end of the conductor track itself can advantageously be constructed as a plug-in device, it thereby being possible to dispense with the fastening of a separate plug.

The sensor and the electronic evaluation unit are separately housed in order to protect the sensor and the electronic evaluation unit during installation at the installation site, for example in a motor vehicle.

In order to produce a position sensor module supplying redundant output signals, a first and a second identically constructed sensor unit respectively consisting of a sensor, a shaped sheet-metal part and an electronic evaluation unit are present, the shaped sheet-metal part of each sensor unit being bent by approximately 90 degrees between the sensor and electronic evaluation unit, and the two sensor units being inserted into the cylindrically designed magnet such that the sensors are arranged lying immediately one above another, while the electronic evaluation units of the two sensor units are arranged decentrally in each case, lying opposite one another, outside the sensor dimensions.

BRIEF DESCRIPTION OF THE DRAWINGS

The invention permits numerous embodiments. One of them is to be explained in more detail with the aid of the figures illustrated in the drawing, in which.

Identical features are marked by identical reference numerals.

DETAILED DESCRIPTION OF THE INVENTION

Figure 1:
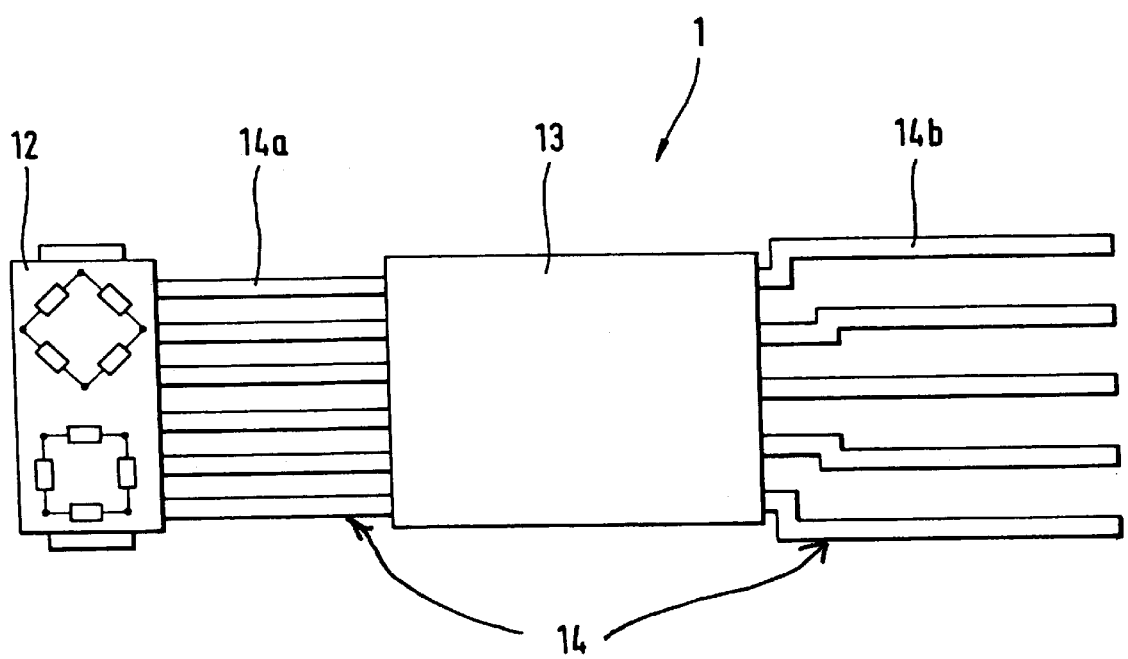
FIG. 1 shows a first embodiment of the position sensor module according to the invention.

FIG. 1 shows a sensor module 1 which consists of a magnetoresistive sensor 12 and an evaluation circuit 13. The sensor 12 is arranged at the end of a lead frame arrangement 14 which is preferably a precision punched frame. The sensor 12 is connected to the evaluation circuit 13 via the fingers 14a of the lead frame arrangement 14. The evaluation circuit 13 can be connected to other electronic circuit devices via the free ends 14b of the lead frame arrangement, which project from the evaluation circuit 13 in a direction opposite to the sensor 12.

The sensor 12 is designed as a magnetoresistive angle sensor and consists of two resistance bridges whose sinusoidal output signals are phase shifted by 90 degrees. The electronic evaluation unit 13 determines the angular position and simultaneously permits compensation of the offset of the angle sensor.

In the present embodiment, six connections 4a are provided between the sensor 12, provided with the housing, and the electronic evaluation unit 13, likewise separately housed, while the electronic evaluation unit 13 has five output terminals 14b for communication with external devices. Like the operating voltage, both control signals and power signals are transmitted via the lead frame connections 14a and 14b.

Figure 2:
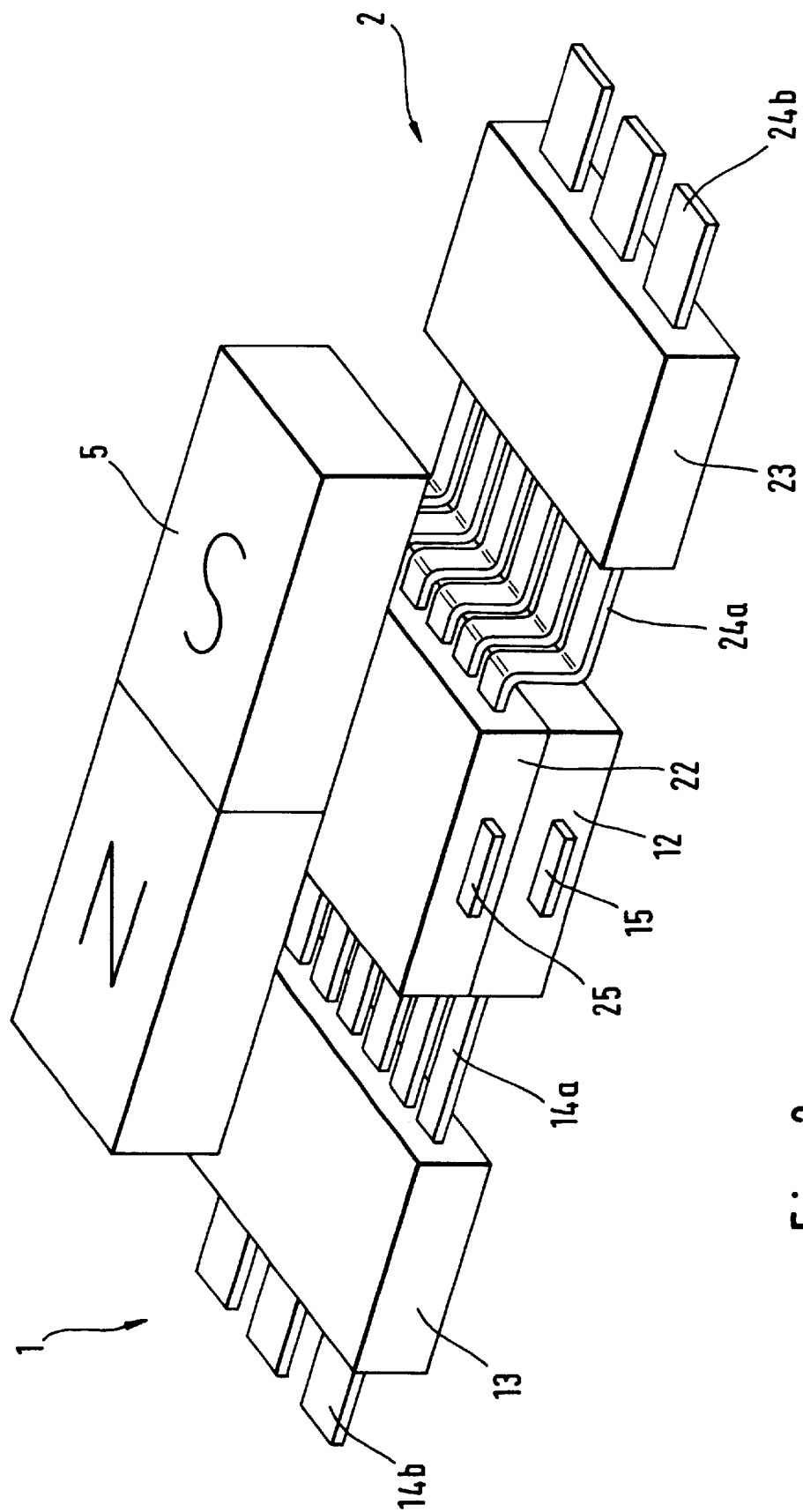
FIG. 2 shows a second design of the position sensor module according to the invention.
Figure 3:
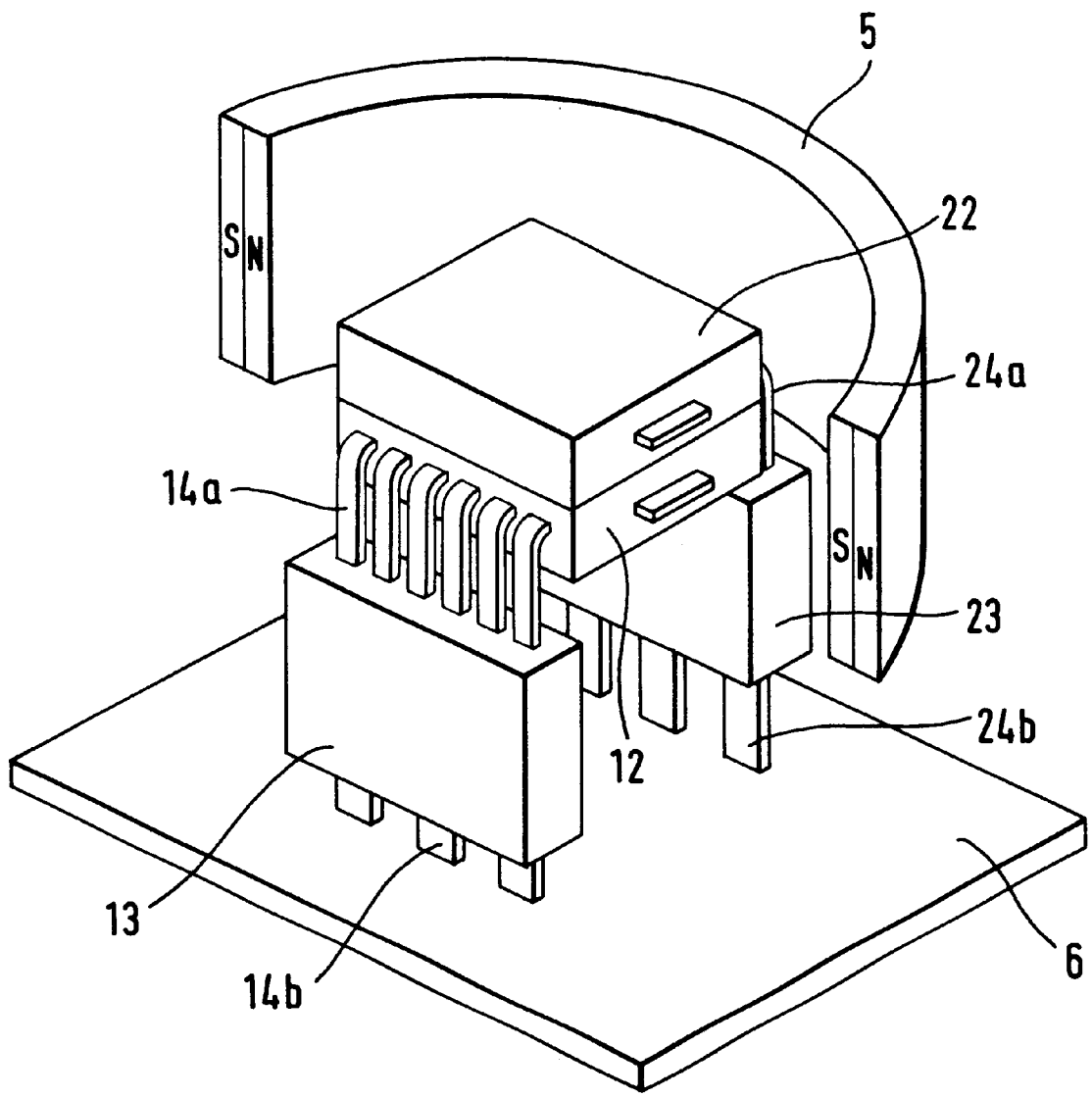
FIG. 3 shows a third embodiment of the position sensor module according to the invention.

Because of the connection between the sensor 12 and electronic evaluation unit 13 by means of the punched and bent part 14a and 14b, this sensor module 11 can be adapted at will to the installation site at which the fingers 14a are bent between the sensors 12 and electronic evaluation unit 13, as is to be explained in more detail using the example of FIGS. 2 and 3.

A redundant system is illustrated in FIG. 2. It consists of two sensor units 1 and 2, which are of identical construction. In this case, the sensor unit 1 consists of the sensor 12, the connections 14a, the electronic evaluation unit 13 and the terminals 14b thereof. The second sensor unit 2 likewise consists of a sensor 22 and is connected via the sheet-metal part punched part 24a to the electronic evaluation unit 23 which, in turn, has sheet-metal punched part 24b as terminal. The two sensor units 1 and 2 are arranged such that the sensors 12 and 22 lie one on another and the electronic evaluation units 13 and 23 point away from one another.

The connections 24a of the second sensor unit 2 between the sensor 22 and evaluation circuit 23 are approximately bent twice by 90 degrees in order for the terminals 14a and 24b, respectively, of the two sensor units to lie acceptably in a plane.

Extending above the sensors 12 and 22 in accordance with the longitudinal direction of the sensor units 1, 2 is a permanent magnet 5 whose magnetic field permeates the sensors 12 and 22, the position-dependent change in the magnetic field being detected by the sensors 12 and 22 and being supplied as output signal to the evaluation circuits 13, 23.

A further representation of the module according to the invention is illustrated in FIG. 3. Here, the permanent magnet 5 is designed as a cylindrical body, only a portion of this magnet 5 being illustrated in FIG. 3, for the sake of clarity. Arranged at the center of the magnet 5 are the redundant sensor units 1, 2, which consist of the sensors 12 and 22, which are likewise arranged lying one above another. Arranged outside the center, in the vicinity of the wall of the magnet 5, in a fashion opposite one another parallel to the axis of the cylindrical magnet 5, are the evaluation units 13 and 23, whose output terminals 14b and 24b respectively, are electrically connected to a printed circuit board 6. The sheet-metal punched part 14a and 24a are bent approximately in the vicinity of the sensors 12, 22 by 90 degrees, and thereby enable a very compact, small sensor arrangement.

Depending on the desired application, the electronic evaluation unit can supply analog or digital output signals, it being possible to trim the electronic evaluation unit for the purpose of temperature compensation. In addition to line breakage and short circuiting between the sensor head and electronic evaluation unit, the electronic evaluation unit can also be used to detect loss of the magnet. Moreover, non-compatible sensor signals can be determined. Monitoring of the evaluation algorithm is possible simultaneously.

Further lead frames, which contain passive components and/or plug-in elements, can advantageously be fitted at terminals 14b and 24b. The overall element can easily be encapsulated by injection molding or processed using conventional joining techniques such as shielded metal arc welding, wave soldering, reflow soldering and/or laser processing.

What is claimed is:

1. A sensor module comprising:

(a) a punched sheet-metal lead frame arrangement having fingers for connecting a magnetoresistive sensor to an evaluation circuit;

(b) a magnetoresistive sensor mounted on and electrically connected to the fingers;

(c) an evaluation circuit mounted on and electrically connected to the fingers to receive signals transmitted from the sensor to the evaluation circuit through the fingers; and (d) free ends on the connecting fingers extending from the evaluation circuit for connecting the sensor module to other electronic circuit devices.

2. The sensor module as claimed in claim 1, wherein the magnetoresistive sensor is positioned within a magnetic field.

3. The sensor module as claimed in claim 2, wherein the sensor is positioned approximately at the center of a cylindrically designed permanent magnet.

4. The sensor module as claimed in claim 1 or 2, wherein the sensor is positioned at a first end of the lead frame fingers and a second end of the lead frame fingers project beyond the electronic evaluation unit.

5. The sensor module as claimed in claim 4, wherein the free end or the lead frame finger is electrically connected to a shaped sheet-metal part, which supports passive electric components and on which a contact device is constructed.

6. The sensor module as claimed in claim 4 characterized in that the frame fingers is constructed as a plug-in device.

7. The sensor module as described in claim 3 comprising a first and a second sensor, a shaped sheet-metal part and an evaluation circuit associated with each sensor, a punched lead frame arrangement mounting the sensors and evaluation circuits and having fingers for connecting the sensors to the evaluation circuits, wherein the fingers are bent by approximately 90 degrees between the sensors and electronic evaluation units, and wherein the two sensor units are inserted into the cylindrically designed permanent magnet such that the sensors are arranged lying immediately one above another, while the electronic evaluation units are arranged decentrally outside the sensor dimensions.

\* \* \* \* \*